(12) United States Patent
Zhou

(10) Patent No.: US 11,437,478 B2
(45) Date of Patent: Sep. 6, 2022

(54) SEMICONDUCTOR DEVICE, MANUFACTURE THEREOF, AND A RADIATION MEASUREMENT METHOD

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation; Semiconductor Manufacturing International (Beijing) Corporation

(*) Notice: Subject to any disclaimer, the term of this patent is extended or adjusted under 35 U.S.C. 154(b) by 155 days.

(21) Appl. No.: 16/790,174

(22) Filed: Feb. 13, 2020

(65) Prior Publication Data

US 2020/0185503 A1    Jun. 11, 2020

Related U.S. Application Data

(62) Division of application No. 15/977,877, filed on May 11, 2018, now Pat. No. 10,566,431.

(30) Foreign Application Priority Data

May 12, 2017 (CN) .......................... 201710331657.X

(51) Int. Cl.
    *H01L 29/41*     (2006.01)
    *H01L 29/417*    (2006.01)
    (Continued)

(52) U.S. Cl.
    CPC .... *H01L 29/41791* (2013.01); *G01R 31/2621* (2013.01); *G01R 31/2628* (2013.01);
    (Continued)

(58) Field of Classification Search
None
See application file for complete search history.

(56) References Cited

U.S. PATENT DOCUMENTS 10,026,752 B2*   7/2018   Garcia .................. H03F 3/3066
10,037,989 B1*   7/2018   Cheng ................. H01L 29/6656
(Continued)

FOREIGN PATENT DOCUMENTS

CN           103489863 A     1/2014

*Primary Examiner* — Bilkis Jahan
(74) *Attorney, Agent, or Firm* — Innovation Counsel LLP

(57) ABSTRACT

A semiconductor device, its manufacturing method, and a radiation measurement method are presented, relating to semiconductor techniques. The semiconductor device includes: a substrate comprising a base area and a collector area adjacent to each other; a plurality of semiconductor fins on the substrate, wherein the plurality of semiconductor fins comprises at least a first semiconductor fin and a second semiconductor fin on the base area and separated from each other, the first semiconductor fin comprises an emission area adjacent to the base area, and the second semiconductor fin comprises a first region adjacent to the base area; a first gate structure on the second semiconductor fin; and a first source and a first drain at two opposite sides of the first gate structure and at least partially in the first region. Radiation in a semiconductor apparatus can be measured through this semiconductor device.

10 Claims, 9 Drawing Sheets

(51) Int. Cl.
  *H01L 29/66* (2006.01)
  *G01R 31/26* (2020.01)
  *H01L 27/092* (2006.01)
  *H01L 29/78* (2006.01)
  *H01L 21/8238* (2006.01)

(52) U.S. Cl.
  CPC .. *G01R 31/2648* (2013.01); *H01L 21/823821* (2013.01); *H01L 27/0924* (2013.01); *H01L 29/6681* (2013.01); *H01L 29/785* (2013.01)

(56) References Cited

U.S. PATENT DOCUMENTS

| | | | |
|---|---|---|---|
| 2013/0328162 A1* | 12/2013 | Hu | H01L 27/0635 257/E29.174 |
| 2015/0102348 A1* | 4/2015 | Cai | H01L 29/735 257/69 |
| 2015/0145592 A1* | 5/2015 | Li | G05F 3/16 257/141 |
| 2017/0062564 A1* | 3/2017 | Zhou | H01L 21/76895 |

\* cited by examiner

SEMICONDUCTOR DEVICE, MANUFACTURE THEREOF, AND A RADIATION MEASUREMENT METHOD

CROSS-REFERENCE TO RELATED APPLICATIONS

This application is a divisional application of U.S. patent application Ser. No. 15/977,877 filed on May 11, 2018, which claims priority to Chinese Patent Application No. 201710331657.X filed on May 12, 2017, and all the benefits accruing therefrom under 35 U.S.C. § 119, the contents of the prior applications being incorporated herein by reference.

BACKGROUND

(a) Field of the Invention

This inventive concept relates generally to semiconductor techniques, and more specifically, to a semiconductor device, its manufacturing method, and a radiation measurement method.

(b) Description of the Related Art

With the technical advancement in semiconductor industry, the size of a Metal Oxide Semiconductor Field Effect Transistor (MOSFET) device has been substantially reduced. In a smaller device, however, the Short Channel Effect (SCE) becomes more critical to the performance of the device. Fin Field Effect Transistor (FinFET) possesses good gate control over the channel charges, and therefore allows a further reduction of the size of a Complementary Metal Oxide Semiconductor (CMOS) device. However, narrow semiconductor fins in a small 3-D device may result in inadequate heat dissipation and cause overheating. Overheating in a device will accelerate lattice vibration and lower the migration rate of charge carriers, causing a slow driver current. Overheating may also increase the leakage current, and both these effects lead to deteriorated device performance. Effectively and accurately monitoring overheating of a device remains a challenge in semiconductor industry.

SUMMARY

Based on the investigation to the issues in conventional methods, this inventive concept proposes an innovative solution that remedies at least some issues of the conventional methods.

This inventive concept first presents a semiconductor device, comprising:

a substrate comprising a base area and a collector area adjacent to each other;

a plurality of semiconductor fins on the substrate, wherein the plurality of semiconductor fins comprises at least a first semiconductor fin and a second semiconductor fin on the base area and separated from each other, the first semiconductor fin comprises an emission area adjacent to the base area, and the second semiconductor fin comprises a first region adjacent to the base area;

a first gate structure on the second semiconductor fin; and a first source and a first drain at two opposite sides of the first gate structure and at least partially in the first region.

Additionally, in the aforementioned semiconductor device, the base area may have a conductivity type opposite to those of the collector area and the emission area, and the base area and the first region may have the same conductivity type.

Additional, the aforementioned semiconductor device may further comprise:

a first pseudo gate structure on the second semiconductor fin and a first electrode at least partially in the first region, with the first electrode and the first gate structure at two opposite sides of the first pseudo gate structure, and the first semiconductor fin located closer to the first pseudo gate structure than the first gate structure.

Additionally, in the aforementioned semiconductor device, the second semiconductor fin, the first gate structure, the first source, and the first drain may form a first Metal Oxide Semiconductor (MOS) device, and the first MOS device may be electrically insulated from the base area by applying a first voltage on the first pseudo gate structure and applying a second voltage on the substrate.

Additionally, in the aforementioned semiconductor device, a conductivity type of the first region may be either N type or P type, and when the conductivity type of the first region is N type, the first voltage is larger than or equal to the second voltage; when the conductivity type of the first region is P type, the first voltage is less than or equal to the second voltage.

Additionally, in the aforementioned semiconductor device, the plurality of semiconductor fins may further comprise a third semiconductor fin on the collector area, the third semiconductor fin may comprise a second region adjacent to the collector area, and the second region and the collector area may have the same conductivity type, and the aforementioned semiconductor device may further comprise:

a second electrode at least partially in the emission area; and a third electrode at least partially in the second region.

Additionally, in the aforementioned semiconductor device, the plurality of semiconductor fins may further comprise a fourth semiconductor fin on the base area and separated from the first semiconductor fin, the fourth semiconductor fin may comprise a third region adjacent to the base area, and the third region and the base area may have the same conductivity type, and the aforementioned semiconductor device may further comprise:

a second gate structure on the fourth semiconductor fin, with a second source and a second drain at two opposite sides of the second gate structure and at least partially in the third region; and a second pseudo gate structure on the fourth semiconductor fin and a fourth electrode at least partially in the third region, with the fourth electrode and the second gate structure at two opposite sides of the second pseudo gate structure, and the first semiconductor fin located closer to the second pseudo gate structure than the second gate structure.

Additionally, in the aforementioned semiconductor device, the fourth semiconductor fin, the second gate structure, the second source and the second drain may form a second MOS device, wherein the second MOS device may be electrically insulated from the base area by applying a third voltage on the second pseudo gate structure and the second voltage on the substrate.

Additionally, in the aforementioned semiconductor device, a conductivity type of the third region may be either N type or P type, and when the conductivity type of the third region is N type, the third voltage is larger than or equal to the second voltage; when the conductivity type of the third region is P type, the third voltage is less than or equal to the second voltage.

Additionally, in the aforementioned semiconductor device, the first voltage may be equal to the third voltage.

Additionally, the aforementioned semiconductor device may further comprise:

a first trench isolation component on the substrate separating the first semiconductor fin and the second semiconductor fin; and a second trench isolation component on the substrate separating the first semiconductor fin and the fourth semiconductor fin.

Additionally, the aforementioned semiconductor device may further comprise:

a third trench isolation component around the plurality of semiconductor fins, with the depth of the third trench isolation component in a range of 500 angstrom to 3000 angstrom.

Additionally, the aforementioned semiconductor device may further comprise:

a dielectric layer on the first trench isolation component, the second trench isolation component, and the third trench isolation component.

This inventive concept further presents a radiation measurement method, comprising:

obtaining a baseline curve depicting a relationship between a voltage between a base area and an emission area of a Bipolar Junction Transistor (BJT) device in a semiconductor device and an environmental temperature while a power device in the semiconductor device is turned off, wherein the BJT device is adjacent to the power device;

obtaining a test curve depicting a relationship between the voltage between the base area and the emission area of the BJT and the environmental temperature while the power device is turned on; and measuring a radiation of the power device by measuring a deviation of the test curve from the baseline curve.

Additionally, in the aforementioned method, the BJT device may be connected to the power device through its base area, and the power device may be a Metal Oxide Semiconductor (MOS) device.

Additionally, the aforementioned measurement method may further comprise:

before obtaining a baseline curve, electrically insulating the power device from the base area of the BJT device.

Additionally, in the aforementioned measurement method, the semiconductor device may be the aforementioned semiconductor device of this inventive concept, the power device may be the first MOS device in that semiconductor device, and the power device may be electrically insulated from the base area of the BJT by applying a first voltage to the first pseudo gate structure in that semiconductor device and a second voltage to the substrate in that semiconductor device.

Additionally, in the aforementioned measurement method, electrically insulating the first MOS device from the base area of the BJT device may comprise:

setting the first voltage larger than or equal to the second voltage if a conductivity type of the first region in the aforementioned semiconductor device is N type; or setting the first voltage less than or equal to the second voltage if the conductivity type of the first region in the aforementioned semiconductor device is P type.

Additionally, in the aforementioned measurement method, the semiconductor device may comprise a plurality of power devices, and obtaining a baseline curve may comprise:

obtaining a sum of a base voltage between a base area and an emission area of a power device for all the power devices when all the power devices are turned off;

computing an average base voltage for all the power devices; and obtaining a baseline curve depicting a relationship between the average base voltage and an environmental temperature, and obtaining a test curve may comprise:

obtaining a sum of a test voltage between a base area and an emission area of a power device for all the power devices when all the power devices are turned on;

computing an average test voltage for all the power devices; and obtaining a test curve depicting a relationship between the average test voltage and an environmental temperature.

This inventive concept further present a semiconductor device manufacturing method, comprising:

providing a semiconductor structure, wherein the semiconductor structure comprises:

a substrate comprising: a base area and a collector area; and a plurality of semiconductor fins on the substrate, wherein the plurality of semiconductor fins comprise at least a first semiconductor fin and a second semiconductor fin on the base area and separated from each other, wherein the first semiconductor fin comprises an emission area adjacent to the base area, and the second semiconductor fin comprises a first region adjacent to the base area;

forming a first initial gate structure on the second semiconductor fin;

forming a first source and a first drain at two opposite sides of the first initial gate structure and at least partially in the first region;

forming a dielectric layer on the semiconductor structure, with the dielectric layer exposing an upper surface of the first initial gate structure;

forming a first notch by removing the first initial gate structure; and forming a first gate structure in the first notch.

Additionally, in the aforementioned manufacturing method, the base area may have a conductivity type opposite to those of the collector area and the emission area, and the base area and the first region may have the same conductivity type.

Additionally, in the aforementioned manufacturing method, when forming the first initial gate structure, a second initial gate structure may be formed on the second semiconductor fin and separated from the first initial gate structure, with the first semiconductor fin located closer to the second initial gate structure than the first initial gate structure, when forming the first source and the first drain, a first electrode may be formed at least partially in the first region, with the first electrode and the first initial gate structure at two opposite sides of the second initial gate structure, when forming the dielectric layer, the dielectric layer may expose an upper surface of the second initial gate structure, when forming the first notch, a second notch may be formed by removing the second initial gate structure, and when forming the first gate structure, a first pseudo gate structure may be formed in the second notch.

Additionally, in the aforementioned manufacturing method, the plurality of semiconductor fins may further comprise a third semiconductor fin on the collector area, wherein the third semiconductor fin comprises a second region adjacent to the collector area, and the second region and the collector area have the same conductivity type, and when forming the first electrode, a second electrode at least partially in the emission area and a third electrode at least partially in the second region may be formed.

Additionally, in the aforementioned manufacturing method, the plurality of semiconductor fins may further comprise a fourth semiconductor fin on the base area and separated from the first semiconductor fin, wherein the fourth semiconductor fin comprises a third region adjacent to the base area, and the third region and the base area have the same conductivity type, when forming the first initial gate structure, a third initial gate structure and a fourth initial gate structure may be formed on the fourth semiconductor fin and separated from each other, with the first semiconductor fin located closer to the fourth initial gate structure than the third initial gate structure, when forming the first source and the first drain, a second source and a second drain may be formed at two opposite sides of the third initial gate structure and at least partially in the third region, and a fourth electrode at least partially in the third region may be formed, with the fourth electrode and the third initial gate structure at two opposite sides of the fourth initial gate structure.

Additionally, in the aforementioned manufacturing method, when forming the dielectric layer, the dielectric layer may expose upper surfaces of the third initial gate structure and the fourth initial gate structure, when forming the first notch, a third notch and a fourth notch may be formed by removing the third initial gate structure and the fourth initial gate structure, respectively, and when forming the first gate structure, a second gate structure may be formed in the third notch, and a second pseudo gate structure may be formed in the fourth notch.

Additionally, in the aforementioned manufacturing method, the semiconductor structure may further comprise:

a first trench isolation component on the substrate separating the first semiconductor fin and the second semiconductor fin; and a second trench isolation component on the substrate separating the first semiconductor fin and the fourth semiconductor fin.

Additionally, in the aforementioned manufacturing method, the semiconductor structure may further comprise:

a third trench isolation component around the plurality of semiconductor fins, with the depth of the third trench isolation component in a range of 500 angstrom to 3000 angstrom, and the dielectric layer on the first trench isolation component, the second trench isolation component, and the third trench isolation component.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1A:
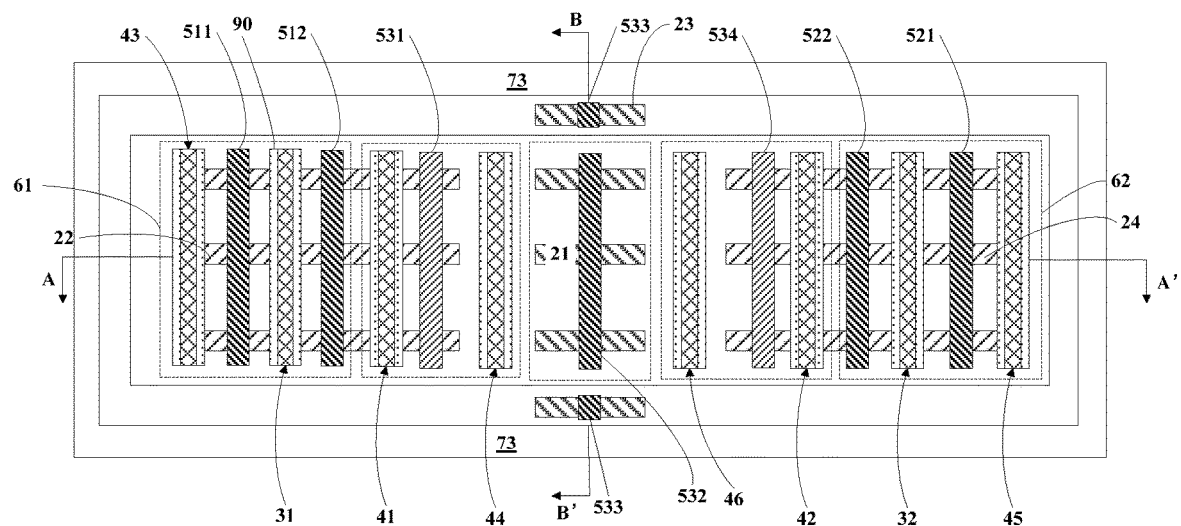
FIG. 1A shows a top plan view of a semiconductor device in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 1B:
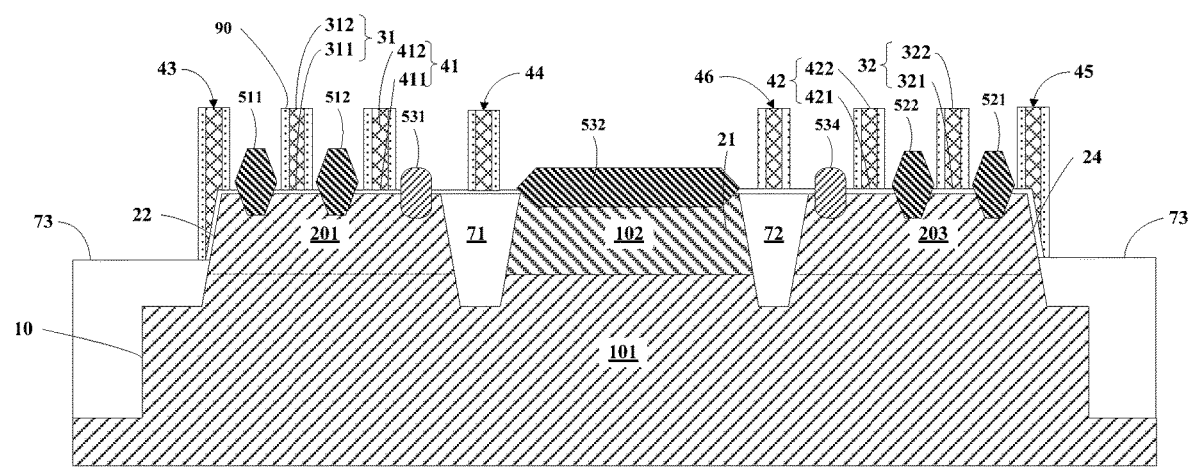
FIG. 1B shows a schematic sectional view of the semiconductor device in FIG. 1A at a section defined by line A-A' in FIG. 1A.
Figure 1C:
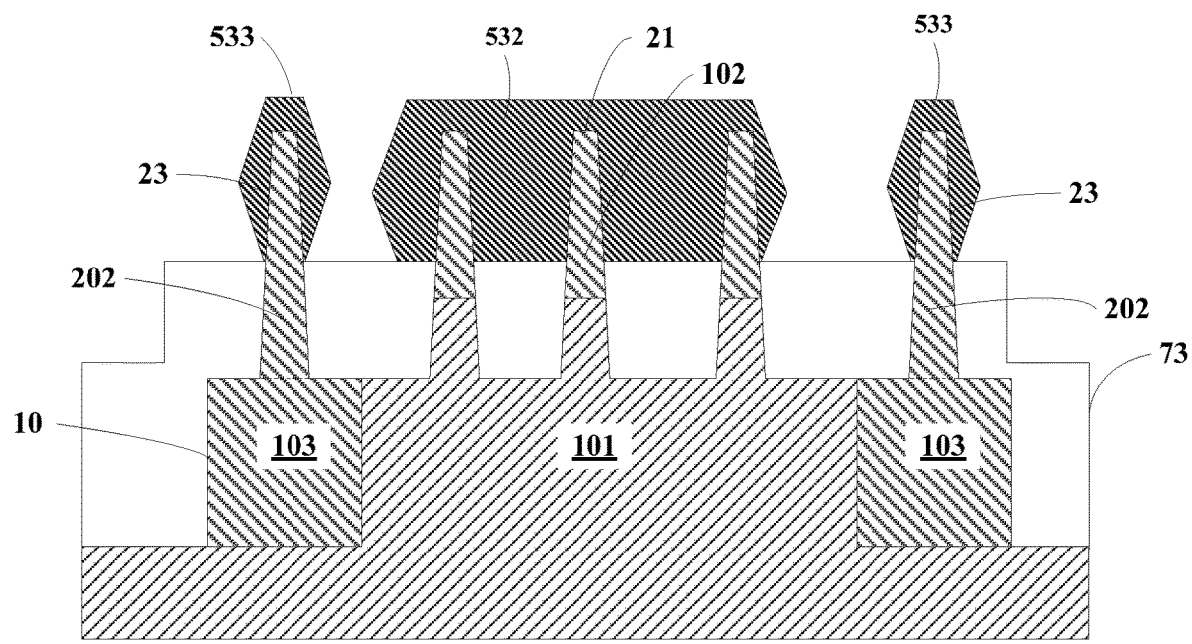
FIG. 1C shows a schematic sectional view of the semiconductor device in FIG. 1A at a section defined by line B-B' in FIG. 1A.

FIG. 1A shows a top plan view of a semiconductor device in accordance with one embodiment of this inventive concept, and FIGS. 1B and 1C show schematic sectional views of that semiconductor device at a section defined by line A-A' and line B-B' in FIG. 1A, respectively. This semiconductor device is described below with reference to these drawings.

Referring to FIG. 1C, the semiconductor device may comprise a substrate 10 comprising a base area 101 and a collector area 103 adjacent to each other. The base area 101 and the collector area 103 may have opposite conductivity types. For example, the base area 101 may be P type and the collector area 103 may be N type, or vice versa.

Referring to FIGS. 1A, 1B, and 1C, the semiconductor device may further comprise a plurality of semiconductor fins on the substrate 10. The plurality of semiconductor fins comprises at least a first semiconductor fin 21 and a second semiconductor fin 22 on the base area 101 and separated from each other. The first semiconductor fin 21 has an emission area 102 adjacent to the base area 101. The base area 101 and the emission area 102 may have opposite conductivity types. For example, the base area 101 may be P type and the emission area 102 may be N type, or vice versa. The second semiconductor fin 22 may comprise a first region 201 adjacent to the base area 101. Optionally, the first region 201 and the base area 101 may have the same conductivity type, for example, they can both be N type or P type.

Referring to FIGS. 1A and 1B, the semiconductor device may further comprise a first gate structure 31 on the second semiconductor fin 22, and a first source 511 and a first drain 512 at two opposite sides of the first gate structure 31 and at least partially in the first region 201. For example, the first gate structure 31 may comprise a first gate insulation layer 311 (which may be made of silicon dioxide) on the second semiconductor fin 22 and a first gate 312 on the first gate insulation layer 311. The first gate 312 may be made of polycrystalline silicon or a metallic material such as tungsten. In one embodiment, the first gate structure 31 may further comprise a work function metal layer (not shown in the drawings) between the first gate insulation layer 311 and the first gate 312. In this embodiment, the second semiconductor fin 22, the first gate structure 31, the first source 511, and the first drain 512 form a first Metal Oxide Semiconductor (MOS) device 61.

In the embodiment described above, the base area 101, the emission area 102, and the collector area 103 may form a Bipolar Junction Transistor (BJT) device. When the first MOS device 61 is turned on, the heat it generates will, through the substrate 10, transmit to the BJT device and increase its temperature. Since the voltage between a base area and an emission area of the BJT device ($V_{BE}$) is sensitive to a temperature change, the radiation of the first MOS device 61 may be measured by comparing two $V_{BE}$-vs-temperature curves: one with the first MOS device 61 turned on and one with it turned off.

For example, when the first MOS device 61 is turned off, a first baseline curve can be obtained by measuring the relationship between the voltage between the base area and the emission area of the BJT device ($V_{BE}$) and the temperature. When the first MOS device 61 is turned on, a first test curve can be obtained by measuring the relationship between $V_{BE}$ and the temperature. By comparing the first baseline curve with the first test curve, the radiation of the first MOS device 61 can be measured through the deviation of the first test curve from the first baseline curve. The more deviation, the more radiation the first MOS device 61 generates.

Referring to FIGS. 1A and 1B, in one embodiment, the semiconductor device may further comprise a first pseudo gate structure 41 on the second semiconductor fin 22 and a first electrode 531 at least partially in the first region 201, with the first electrode 531 and the first gate structure 31 at two opposite sides of the first pseudo gate structure 41, and the first semiconductor fin 21 located closer to the first pseudo gate structure 41 than the first gate structure 31. The first pseudo gate structure 41 may comprise a first pseudo gate insulation layer 411 (which may be made of silicon dioxide) on the second semiconductor fin 22 and a first pseudo gate 412 on the first pseudo gate insulation layer 411. The first pseudo gate 412 may be made of polycrystalline silicon or a metallic material such as tungsten. In one embodiment, the first pseudo gate structure 41 may further comprise a work function metal layer (not shown in the drawings) between the first pseudo gate insulation layer 411 and the first pseudo gate 412. In this embodiment, the first pseudo gate structure 41, the first drain 512, the first electrode 531, and a portion of the first region 201 between the first drain 512 and the first electrode 531 may form a first pseudo MOS device.

In some embodiments, to reduce electrical interference, the first MOS device 61 may be electrically insulated from the base area 101 by applying a first voltage on the first pseudo gate structure 41 and a second voltage on the substrate 10 (e.g., on the base area 101 of the substrate 10).

In one embodiment, a conductivity type of the first region 201 may be N type and the first voltage is larger than or equal to the second voltage. In this embodiment, since the conductivity type of the first region 201 is N type, both the first MOS device 61 and the first pseudo MOS device are P-type MOS (PMOS) devices. By setting the first voltage on the first pseudo gate structure 41 larger than or equal to the second voltage on the substrate 10 (e.g., by connecting the first pseudo gate structure 41 to a source voltage $V_{dd}$), the first pseudo MOS device is turned off, and the first MOS device 61 is electrically insulated from the first electrode 531, and thus from the base area 101 as well.

In another embodiment, a conductivity type of the first region 201 may be P type and the first voltage is less than or equal to the second voltage. In this embodiment, since the conductivity type of the first region 201 is P type, both the first MOS device 61 and the first pseudo MOS device are N-type MOS (NMOS) devices. By setting the first voltage on the first pseudo gate structure 41 less than or equal to the second voltage on the substrate 10 (e.g., by connecting the first pseudo gate structure 41 to ground), the first pseudo MOS device is turned off, and the first MOS device 61 is electrically insulated from the first electrode 531, and thus from the base area 101 as well.

Referring to FIGS. 1A and 1C, in one embodiment, the plurality of semiconductor fins may further comprise a third semiconductor fin 23 on the collector area 103, wherein the third semiconductor fin 23 may comprise a second region 202 adjacent to the collector area 103, and the second region 202 and the collector region 103 may have the same conductivity type (e.g., they may both be P type or N type). Referring to FIGS. 1A, 1B, and 1C, the semiconductor device may further comprise a second electrode 532 at least partially in the emission area 102, and a third electrode 533 at least partially in the second region 202. In this embodiment, the first electrode 531, the second electrode 532, and the third electrode 533 work as an elicited electrode for the base area 101, the emission area 102, and the collector area 103, respectively.

Referring to FIGS. 1A and 1B, in one embodiment, the plurality of semiconductor fins may further comprise a fourth semiconductor fin 24 on the base area 101 and separated from the first semiconductor fin 21. The fourth semiconductor fin 24 may comprise a third region 203 adjacent to the base area 101. Optionally, the third region 203 and the base area 101 may have the same conductivity type (e.g., they may both be N type or P type).

Referring to FIGS. 1A and 1B, in one embodiment, the semiconductor device may further comprise a second gate structure 32 on the fourth semiconductor fin 24, and a second source 521 and a second drain 522 at two opposite sides of the second gate structure 32 and at least partially in the third region 203. For example, the second gate structure 32 may comprise a second gate insulation layer 321 (which may be made of silicon dioxide) on the fourth semiconductor fin 24 and a second gate 322 on the second gate insulation layer 321. The second gate 322 may be made of polycrystalline silicon or a metallic material such as tungsten. In one embodiment, the second gate structure 32 may further comprise a work function metal layer (not shown in the drawings) between the second gate insulation layer 321 and the second gate 322. In this embodiment, the fourth semiconductor fin 24, the second gate structure 32, the second source 521, and the second drain 522 form a second MOS device 62, with the first MOS device 61 and the second MOS device 62 located symmetrically with respect to the first semiconductor fin 21.

Referring to FIGS. 1A and 1B, in one embodiment, the semiconductor device may further comprise a second pseudo gate structure 42 on the fourth semiconductor fin 24 and a fourth electrode 534 at least partially in the third region 203, with the fourth electrode 534 and the second gate structure 32 at two opposite sides of the second pseudo gate structure 42, and the first semiconductor fin 21 located closer to the second pseudo gate structure 42 than the second gate structure 32. The second pseudo gate structure 42 may comprise a second pseudo gate insulation layer 421 (which may be made of silicon dioxide) on the fourth semiconductor fin 24 and a second pseudo gate 422 on the second pseudo gate insulation layer 421. The second pseudo gate 422 may be made of polycrystalline silicon or a metallic material such as tungsten. In one embodiment, the second pseudo gate structure 42 may further comprise a work function metal layer (not shown in the drawings) between the second pseudo gate insulation layer 421 and the second pseudo gate 422. In this embodiment, the second pseudo gate structure 42, the second drain 522, the fourth electrode 534, and a portion of the third region 203 between the second drain 522 and the fourth electrode 534 may form a second pseudo MOS device, and the fourth electrode 534 may work as an elicited electrode for the base area 101.

In some embodiments, to reduce electrical interference, the second MOS device 62 may be electrically insulated from the base area 101 by applying a third voltage on the second pseudo gate structure 42 and the second voltage on the substrate 10.

In one embodiment, a conductivity type of the third region 203 may be N type and the third voltage is larger than or equal to the second voltage. In this embodiment, since the conductivity type of the third region 203 is N type, both the second MOS device 62 and the second pseudo MOS device are PMOS devices. By setting the third voltage on the second pseudo gate structure larger than or equal to the second voltage on the substrate, the second pseudo MOS device is turned off, and the second MOS device 62 is electrically insulated from the fourth electrode 534, and thus from the base area 101 as well.

In another embodiment, the conductivity type of the third region 203 may be P type and the third voltage is less than or equal to the second voltage. In this embodiment, since the conductivity type of the third region 203 is P type, both the second MOS device 62 and the second pseudo MOS device are NMOS devices. By setting the third voltage on the second pseudo gate structure less than or equal to the second voltage on the substrate, the second pseudo MOS device is turned off, and the second MOS device 62 is electrically insulated from the fourth electrode 534, and thus from the base area 101 as well.

For convenience, the first voltage may be set to equal to the third voltage, that is, the first pseudo gate structure and the second pseudo gate structure are connected to the same voltage.

Referring to FIGS. 1B and 1C, in some embodiments, the semiconductor device may further comprise a first trench isolation component 71 on the substrate 10 separating the first semiconductor fin 21 and the second semiconductor fin 22, and a second trench isolation component 72 on the substrate 10 separating the first semiconductor fin 21 and the fourth semiconductor fin 24. For example, the first trench isolation component 71 and the second trench isolation component 72 may both be a Shallow Trench Isolation (STI).

Referring to FIGS. 1A, 1B, and 1C, in some embodiments, the semiconductor device may further comprise a third trench isolation component 73 around the plurality of semiconductor fins, with the depth of the third trench isolation component 73 in a range of 500 angstrom to 3000 angstrom (e.g., 1000 angstrom or 2000 angstrom). The third trench isolation component 73 is a deep trench located at the boundary of the semiconductor device, it works as an insulator to ensure sufficient heat generated from the MOS devices can be contained and transmitted to the BJT device to ensure a proper operation of the radiation measurement method.

Referring to FIGS. 1A and 1B, in some embodiments, the semiconductor device may further comprise a third pseudo gate structure 43 at the edge of the second semiconductor fin 22, a fourth pseudo gate structure 44 on the first trench isolation component 71, a fifth pseudo gate structure 45 at the edge of the fourth semiconductor fin 24, and a fourth pseudo gate structure 46 on the second trench isolation component 72.

Referring to FIGS. 1A and 1B, in some embodiments, the semiconductor device may further comprise spacers 90 on side surfaces of each of the gate structures and the pseudo gate structures.

In some embodiments, the semiconductor device may further comprise a dielectric layer on the first trench isolation component, the second trench isolation component, and the third trench isolation component, with the dielectric layer surrounding each of the gate structures and the pseudo gate structures. The dielectric layer may be made of any suitable dielectric material such as silicon dioxide. It should be understood that, for the purpose of conciseness and convenience, the dielectric layer is not shown in FIGS. 1A, 1B, and 1C, but a person of ordinarily skills in the art in this field would understand that the semiconductor device may comprise such a dielectric layer.

In some embodiments, the semiconductor device may comprise a plurality of MOS devices (including the first and/or the second MOS devices), and those MOS devices may form a multi-finger pattern to allow more heat dissipation for radiation measurement.

Figure 2:
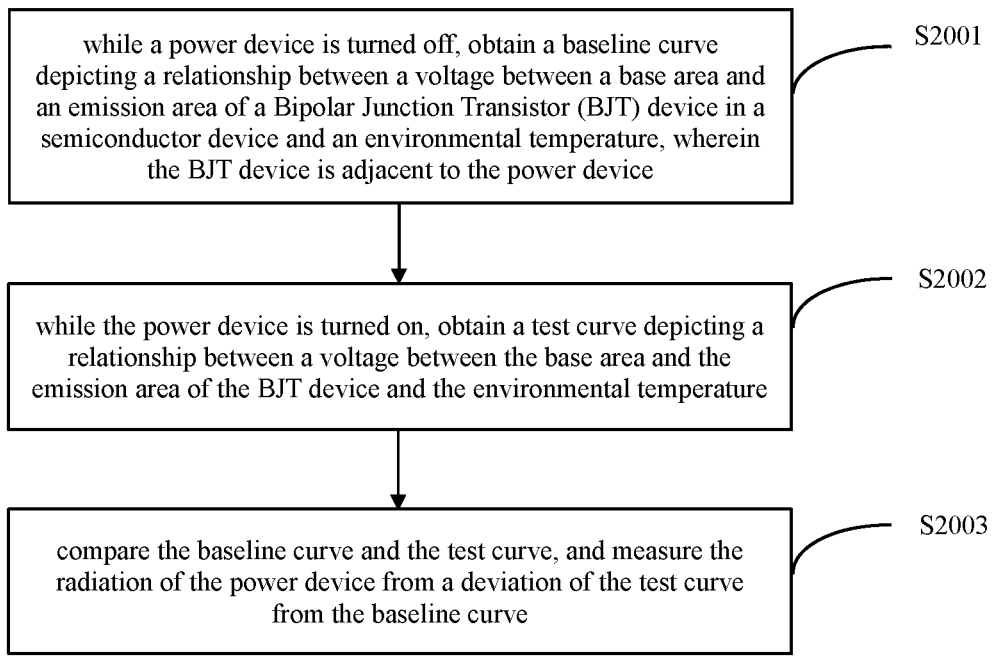
FIG. 2 shows a flowchart illustrating a radiation measurement method in accordance with one embodiment of this inventive concept.

FIG. 2 shows a flowchart illustrating a radiation measurement method in accordance with one embodiment of this inventive concept.

In step S2001, while a power device is turned off, a baseline curve depicting a relationship between a voltage between a base area and an emission area of a BJT device ($V_{BE}$) in a semiconductor device and an environmental temperature is obtained, wherein the BJT device is adjacent to the power device. The power device may be a MOS device, and the BJT device may be adjacent to the power device via its base area.

In this embodiment, to measure a corresponding $V_{BE}$ at a given environmental temperature, the voltage at the base area ($V_B$) and the voltage at the emission area ($V_E$) may both be initially set at 0 V, then the voltage at the base area ($V_B$) is gradually changed while the corresponding current in the emission area ($I_E$) is monitored. Since $V_{BE}=V_B-V_E=V_B-0=V_B$, the corresponding $V_{BE}$ at this environmental temperature is the voltage at the base area ($V_B$) when $I_E$ reaches a target value.

In one example, when the conductivity type of the base area 101 is N type, to find a corresponding $V_{BE}$ at a given environmental temperature, the voltage at the base area ($V_B$) can be gradually changed from 0 V to a negative value. For example, $V_B$ may be changed from 0 V to −2 V at a −0.1 V step, that is, $V_B$=0 V, −0.1 V, −0.2 V, . . . , −2 V, and a corresponding $I_E$ at each step will be monitored. When $I_E$ reaches a target value (e.g., when $I_E$ falls within a range of $1.0\times10^{-7}$ A per unit area to $1.0\times10^{-5}$ A per unit area, such as $1.0\times10^{-6}$ A per unit area, wherein a unit area may be 1 um$^2$), the voltage between the base area and the emission area is $V_{BE}$ at this environmental temperature.

In another example, when the conductivity type of the base area 101 is P type, to find a corresponding $V_{BE}$ at a given environmental temperature, the voltage at the base area ($V_B$) can be gradually changed from 0V to a positive value. For example, $V_B$ may be changed from 0V to 2 V in a 0.1 V step, that is, $V_B$=0 V, 0.1 V, 0.2 V, . . . , 2 V, and a corresponding $I_E$ at each step will be monitored. When $I_E$ reaches a target value (e.g., when $I_E$ falls within a range of $1.0\times10^{-7}$ A per unit area to $1.0\times10^{-5}$ A per unit area, such as $1.0\times10^{-6}$ A per unit area, wherein a unit area may be 1 um$^2$), the voltage between the base area and the emission area is $V_{BE}$ at this environmental temperature.

Each $V_{BE}$ and a corresponding environmental temperature generates a point in the baseline curve. By repeating the above procedures on different environmental temperatures, a series of points, each corresponding to a particular environmental temperature, will be recorded and all these points form the baseline curve depicting the relationship between $V_{BE}$ and the environmental temperature. Different environmental temperatures can be achieved by gradually heating the test platform so that a few discrete environmental temperatures (e.g., 5° C., 15° C., 25° C., 50° C., 80° C., 120° C., and 150° C.) can be achieved.

In one embodiment, this radiation measurement method can be applied on the semiconductor device described above.

In one example, the power device may be the first MOS device described above, and step S2001 may comprise: when the first MOS device is turned off, obtaining a first baseline curve depicting a relationship between a voltage between a base area and an emission area of a BJT device ($V_{BE}$) and an environmental temperature. The first baseline curve shows the effect of the environmental temperature on $V_{BE}$.

In another example, the power device may comprise the first MOS device and the second MOS device described before, and step S2001 may comprise: when both the first MOS device and the second MOS device are turned off, obtaining a second baseline curve depicting a relationship between a voltage between a base area and an emission area of a BJT device ($V_{BE}$) and an environmental temperature.

In step S2002, while the power device is turned on, a test curve depicting a relationship between a voltage between the base area and the emission area of the BJT device ($V_{BE}$) and the environmental temperature is obtained.

In one example, step S2002 may comprise: when the first MOS device is turned on, obtaining a first test curve depicting a relationship between a voltage between the base area and the emission area of the BJT device ($V_{BE}$) and an environmental temperature.

In another example, step S2002 may comprise: when both the first MOS device and the second MOS device are turned on, obtaining a second test curve depicting a relationship between a voltage between the base area and the emission area of the BJT device ($V_{BE}$) and an environmental temperature.

In step S2003, the baseline curve is compared with the test curve, and the radiation of the power device is measured through a deviation of the test curve from the baseline curve. The more the test curve deviated from the baseline curve, the more radiation the device produces.

In one example, step S2003 may comprise: comparing the first test curve with the first baseline curve and measuring the radiation of the first MOS device through the deviation of the first test curve from the first baseline curve.

In another example, step S2003 may comprise: comparing the second test curve with the second baseline curve and measuring the radiation of the first and the second MOS devices through the deviation of the second test curve from the second baseline curve.

In this embodiment, a baseline $V_{BE}$-vs-temperature curve is obtained with the power device turned off, and a test $V_{BE}$-vs-temperature curve is obtained with the power device turned on. By comparing these two curves and measuring the deviation of one curve from another, the radiation can be measured.

In one embodiment, the radiation measurement method may further comprise: before obtaining a baseline curve, electrically insulating the power device from the base area of the BJT device.

In one embodiment, the radiation measurement method may be applied on the semiconductor device described above, and the power device may be the first MOS device. Electrically insulating the power device from the base area of the BJT device may comprise: applying a first voltage on the first pseudo gate structure and a second voltage on the substrate to electrically insulate the first MOS device from the base area.

In some embodiments, electrically insulating the power device from the base area may comprise: setting the first voltage larger than or equal to the second voltage if a conductivity type of the first region is N type, or, setting the first voltage less than or equal to the second voltage is the conductivity type of the first region is P type.

In some embodiment, the semiconductor device may comprise a plurality of power devices.

In one embodiment, obtaining a baseline curve may comprise: obtaining a sum of a base voltage between a base area and an emission area of a power device for all the power devices when all the power devices are turned off; computing an average base voltage for all the power devices; and obtaining a baseline curve depicting a relationship between the average base voltage and an environmental temperature.

In another embodiment, obtaining a test curve may comprise: obtaining a sum of a test voltage between a base area and an emission area of a power device for all the power devices when all the power devices are turned on; computing an average test voltage for all the power devices; and obtaining a test curve depicting a relationship between the average test voltage and an environmental temperature.

These two embodiments described above measure a sum of $V_{BE}$ across multiple power devices, and then computes an average $V_{BE}$, therefore they are suitable for radiation measurement on the MOS device with radiation that is too small to be accurately measured on one power device alone.

Figure 3:
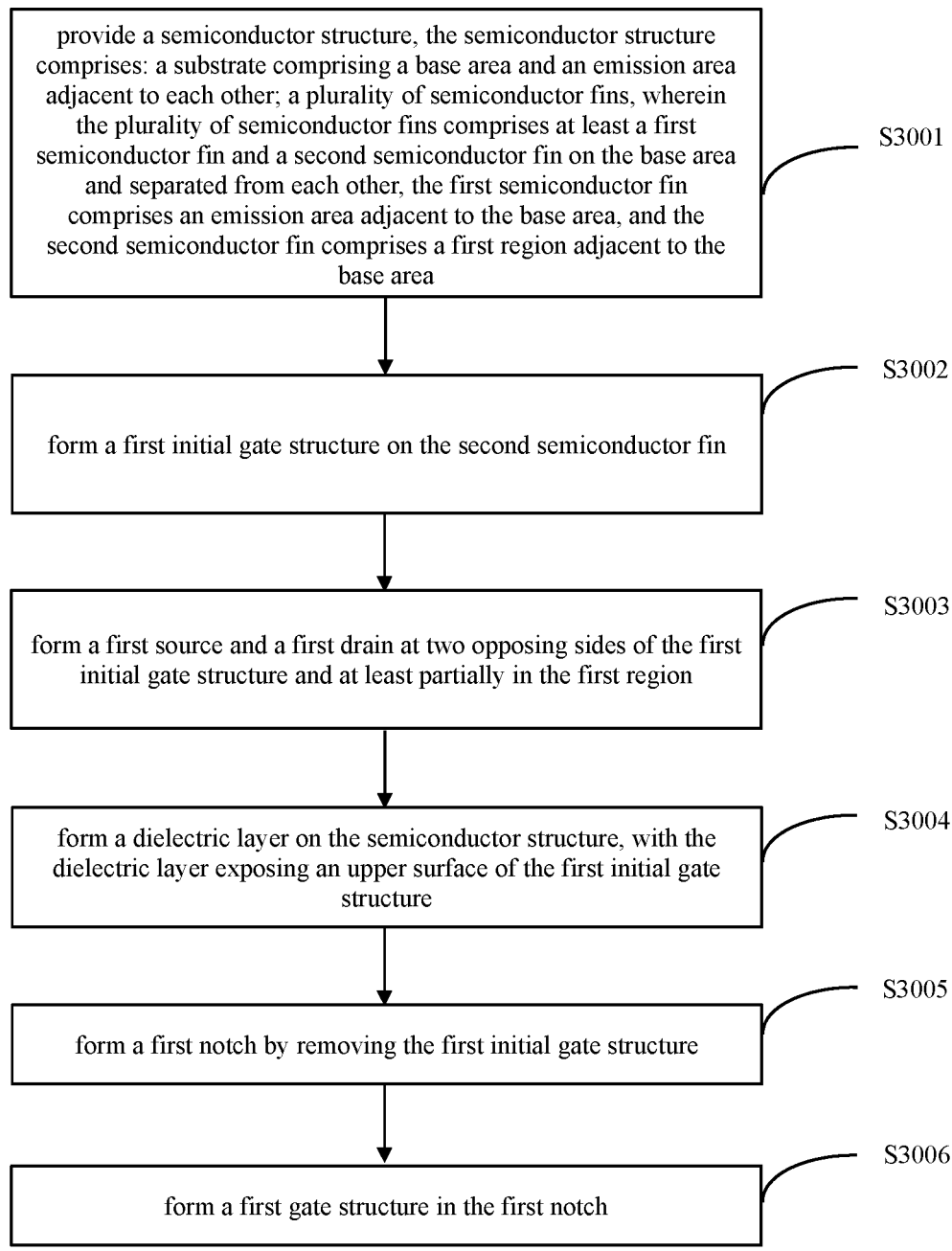
FIG. 3 shows a flowchart illustrating a semiconductor device manufacturing method in accordance with one embodiment of this inventive concept.

FIG. 3 shows a flowchart illustrating a semiconductor device manufacturing method in accordance with one embodiment of this inventive concept.

In step S3001, a semiconductor structure is provided, the semiconductor structure comprises: a substrate comprising a base area and a collector area adjacent to each other; a plurality of semiconductor fins on the substrate, wherein the plurality of semiconductor fins comprises at least a first semiconductor fin and a second semiconductor fin on the base area and separated from each other, the first semiconductor fin comprises an emission area adjacent to the base area, and the second semiconductor fin comprises a first region adjacent to the base area. The base area may have a conductivity type opposite to those of the collector area and the emission area. Optionally, the first region and the base area may have the same conductivity type.

In step S3002, a first initial gate structure is formed on the second semiconductor fin.

In step S3003, a first source and a first drain are formed at two opposite sides of the first initial gate structure and at least partially in the first region.

In step S3004, a dielectric layer is formed on the semiconductor structure, with the dielectric layer exposing an upper surface of the first initial gate structure.

In step S3005, a first notch is formed by removing the first initial gate structure.

In step S3006, a first gate structure is formed in the first notch.

The manufacturing method described above forms a MOS device and a BJT device adjacent to each other, therefore the radiation of the MOS device can be measured by measuring the radiation of the BJT device using the radiation measurement method described above.

FIGS. 4A, 4B, 5, 6A, 6B, 7, 8, 9, and 10 show schematic sectional views illustrating different stages of a semiconductor device manufacturing method in accordance with one or more embodiments of this inventive concept. This semiconductor device manufacturing method is described below with reference to these drawings.

Figure 4A:
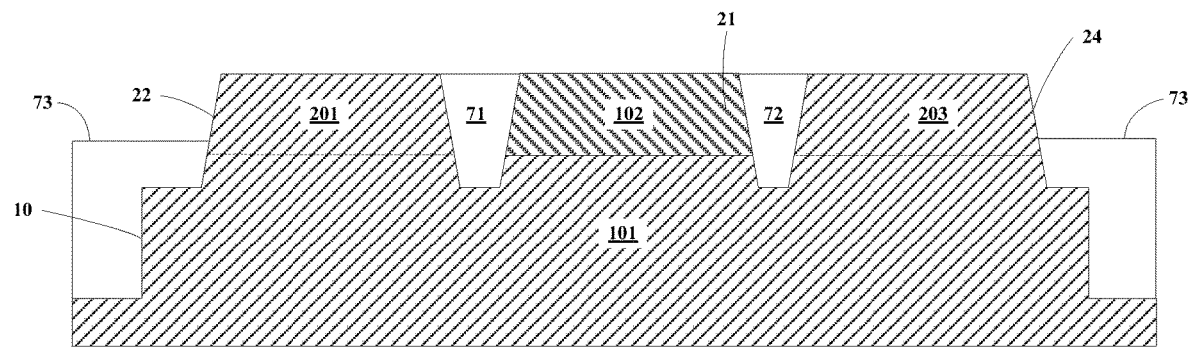
FIGS. 4A, 5, 6A, 7, 8, 9, and 10 show schematic sectional views, observed along an extension direction of a semiconductor fin, illustrating different stages of a semiconductor device manufacturing method in accordance with one or more embodiments of this inventive concept.
Figure 4B:
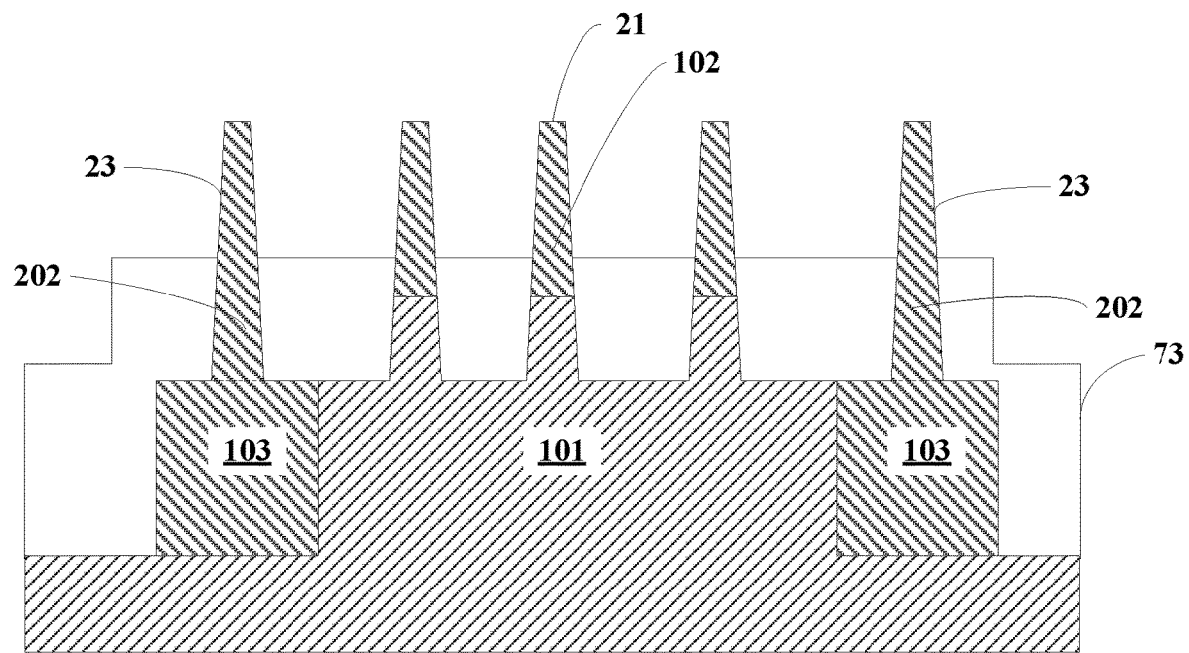
FIGS. 4B and 6B show schematic sectional views, observed along a direction perpendicular to an extension direction of a semiconductor fin, illustrating different stages of a semiconductor device manufacturing method in accordance with one or more embodiments of this inventive concept.

First, referring to FIGS. 4A and 4B, a semiconductor structure is provided. The semiconductor structure may comprise: a substrate 10 (which may be a silicon substrate) comprising a base area 101 and a collector area 103 adjacent to each other. The semiconductor structure may further comprise a plurality of semiconductor fins, wherein the plurality of semiconductor fins comprises at least a first semiconductor fin 21 and a second semiconductor fin 22 on the base area 101 and separated from each other, the first semiconductor fin 21 may comprise an emission area 102 adjacent to the base area 101, and the second semiconductor fin 22 may comprise a first region 201 adjacent to the base area 101.

Referring to FIG. 4B, in one embodiment, the plurality of semiconductor fins may further comprise: a third semiconductor fin 23 on the collector area 103, wherein the third semiconductor fin 23 comprises a second region 202 adjacent to the collector area 103. Optionally, the second region 202 and the collector area 103 may have the same conductivity type.

Referring to FIG. 4A, in one embodiment, the plurality of semiconductor fins may further comprise a fourth semiconductor fin 24 on the base area 101 and separated from the first semiconductor fin 21, wherein the fourth semiconductor fin 24 may comprise a third region 203 adjacent the base area 101. Optionally, the third region 203 and the base area 101 may have the same conductivity type.

Referring to FIG. 4A, in one embodiment, the semiconductor structure may further comprise: a first trench isolation component 71 on the substrate 10 separating the first semiconductor fin 21 and the second semiconductor fin 22. The semiconductor structure may further comprise a second trench isolation component 72 on the substrate 10 separating the first semiconductor fin 21 and the fourth semiconductor fin 24.

Referring to FIGS. 4A and 4B, in one embodiment, the semiconductor structure may further comprise a third trench isolation component 73 around the plurality of semiconductor fins, with the depth of the third trench isolation component 73 in a range of 500 angstrom to 3000 angstrom (e.g., 1000 angstrom or 2000 angstrom).

Figure 5:
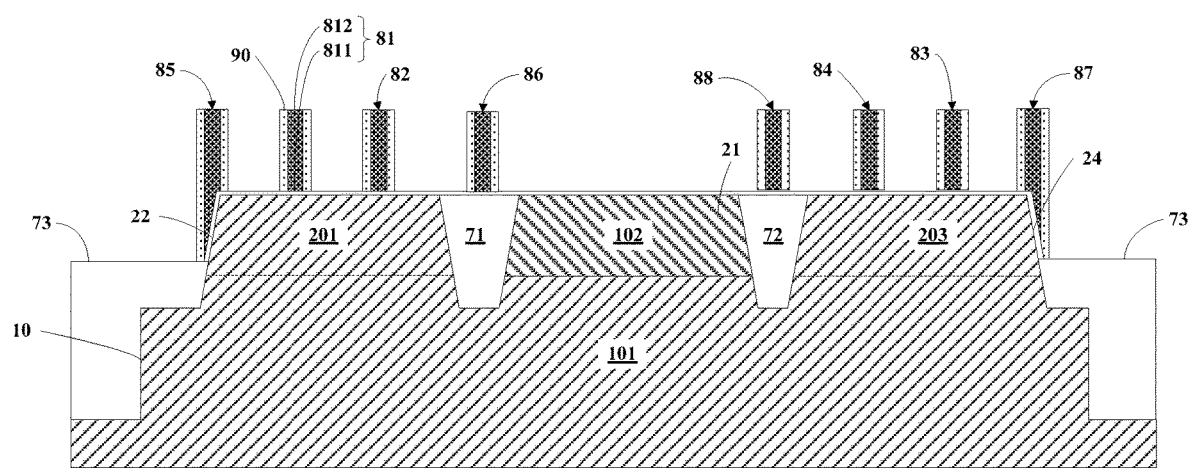

Next, referring to FIG. 5, a first initial gate structure 81 is formed on the semiconductor fin 22. In one embodiment, a second initial gate structure 82 may also be formed on the semiconductor fin 22 and separated from the first initial gate structure 81, with first semiconductor fin 21 located closer to the second initial gate structure 82 than the first initial gate structure 81. In one embodiment, a third initial gate structure 83 and a fourth initial gate structure 84 may also be formed on the fourth semiconductor fin 24 and separated from each other, with the first semiconductor fin 21 located closer to the fourth initial gate structure 84 than the third initial gate structure 83.

Referring to FIG. 5, optionally, in some embodiments, a fifth initial gate structure 85 may be formed at the edge of the second semiconductor fin 22, a sixth initial gate structure 86 may be formed on the first trench isolation component 71, a seventh initial gate structure 87 may be formed on the fourth semiconductor fin 24, and an eighth initial gate structure 88 may be formed on the second trench isolation component 72. These initial gate structures help to epitaxially grow sources, drains and other electrodes.

In some embodiments, each initial gate structure may comprise an initial gate insulation layer 811 (which may be made of silicon dioxide) on a corresponding semiconductor fin and an initial gate 812 (which may be made of polycrystalline silicon) on the initial gate insulation layer 811. For example, the first initial gate structure 81 may comprise an initial gate insulation layer 811 on the second semiconductor fin 22, and an initial gate 812 on the initial gate insulation layer 811.

In one embodiment, spacers 90 (which may be made of silicon dioxide or silicon nitride) may be formed on side surfaces of each of these initial gate structures.

Figure 6A:
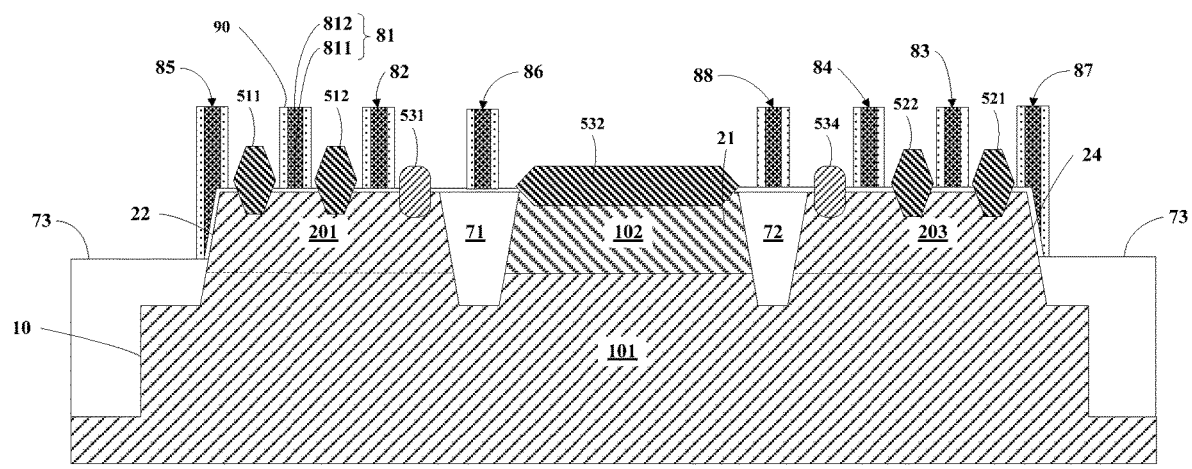

Next, referring to FIG. 6A, a first source 511 and a first drain 512 may be epitaxially grown at two opposite sides of the first initial gate structure 81 and at least partially in the first region 201.

In one embodiment, when forming the first source 511 and the first drain 512, a first electrode 531 at least partially in the first region 201 may also be formed, with the first electrode 531 and the first initial gate structure 81 at two opposite sides of the second initial gate structure 82.

Figure 6B:
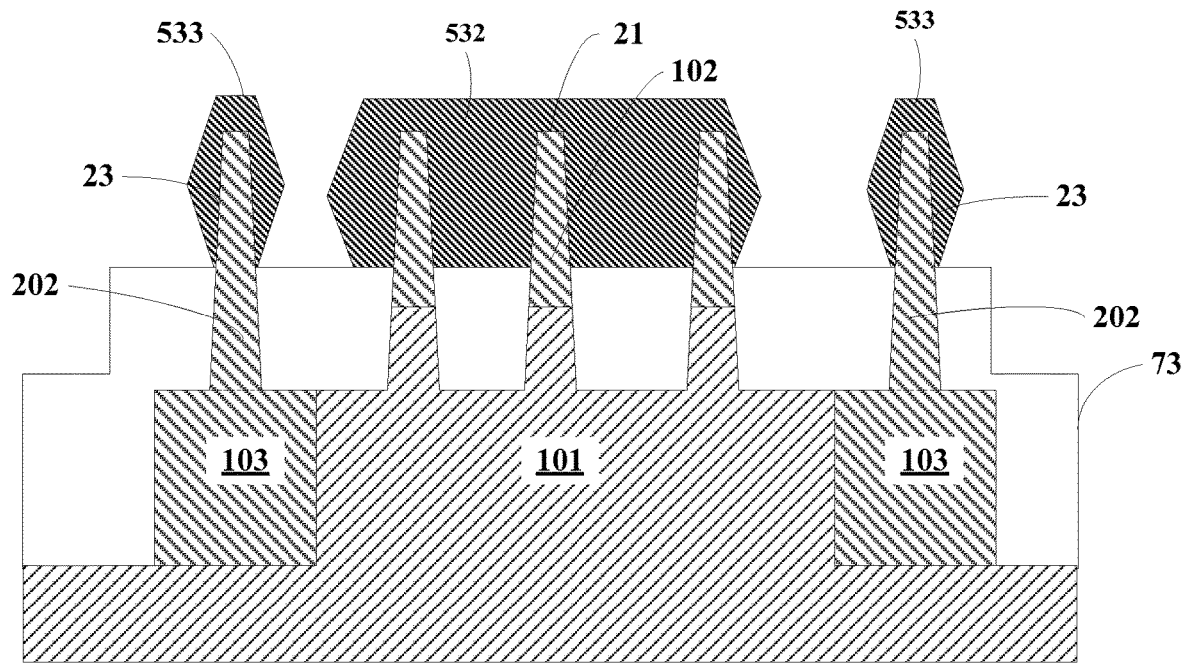

Referring to FIGS. 6A and 6B, in one embodiment, when forming the first electrode 531, a second electrode 532 at least partially in the emission area 102 and a third electrode 533 at least partially in the second region 202 may also be formed (e.g., through epitaxial growth).

Referring to FIG. 6A, in one embodiment, when forming the first source 511 and the first drain 512, a second source 521 and a second drain 522 may also be formed (e.g., through epitaxial growth) at two opposite sides of the third initial gate structure 83 and at least partially in the third region 203, a fourth electrode 534 at least partially in the third region 203 may also be formed, with the fourth electrode 534 and the third initial gate structure 83 at two opposite sides of the fourth initial gate structure 84.

In some embodiments, the portion of the semiconductor fins on which the sources, the drains, and other electrodes are formed may first be etched to form notches, and the corresponding sources, drains, or other electrodes may be formed in the notches by epitaxial growth.

Figure 7:
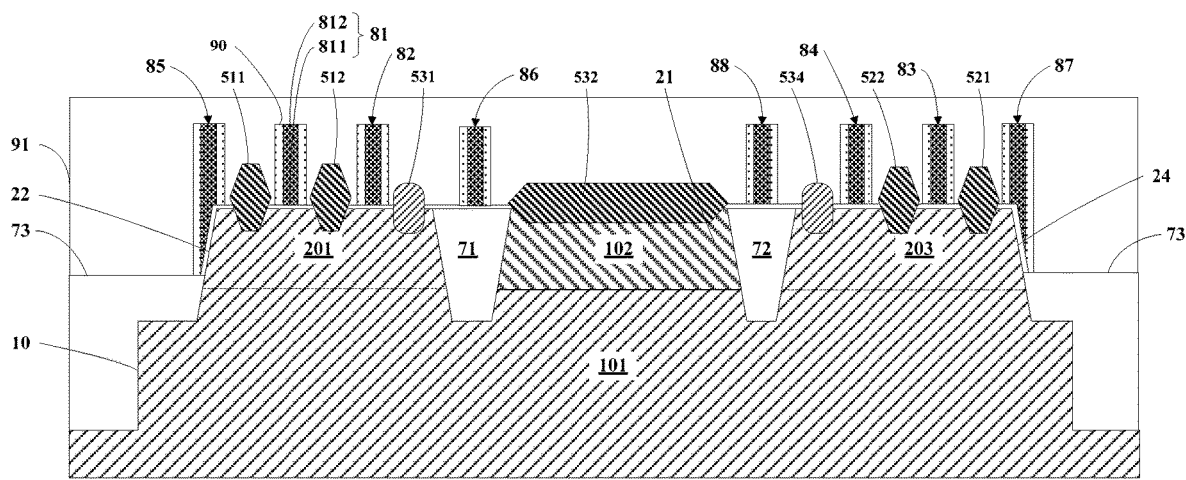
Figure 8:
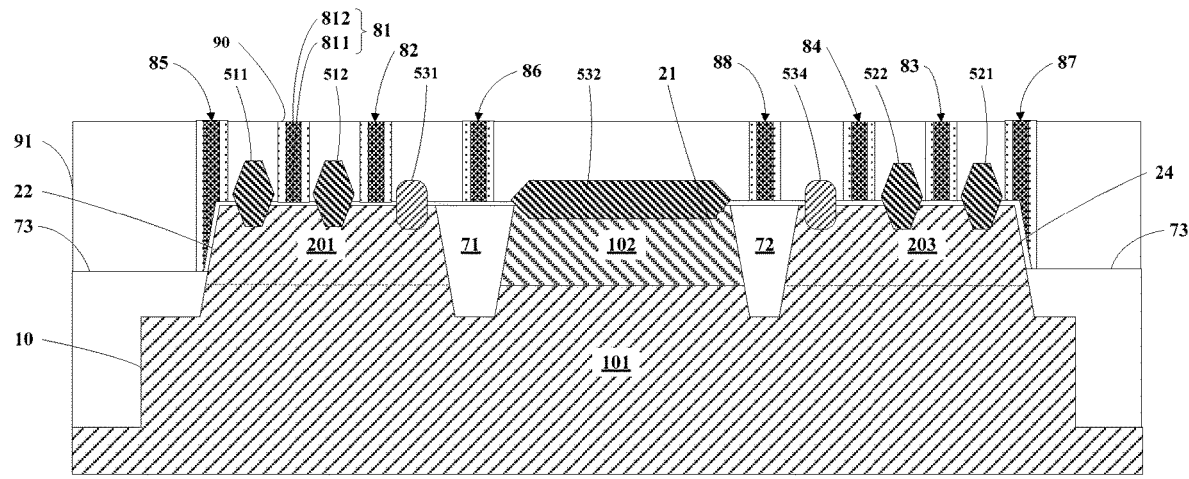

Next, referring to FIG. 7, a dielectric layer 91 is deposited on the semiconductor structure after the first initial gate structure 81 is formed. The dielectric layer 91 may be made of silicon dioxide and cover the first trench isolation component 71, the second trench isolation component 72, and the third trench isolation component 73. Referring to FIG. 8, a planarization process, such as a Chemical Mechanical Planarization (CMP) process, may be applied on the dielectric layer 91 so that an upper surface of the first initial gate structure 81 is exposed.

In some embodiments, when forming the dielectric layer 91, the dielectric layer 91 may expose an upper surface of the second initial gate structure 82, upper surfaces of the third initial gate structure 83 and the fourth initial gate structure 84, and upper surfaces of the fifth initial gate structure 85, the sixth initial gate structure 86, the seventh initial gate structure 87, and the eighth initial gate structure 88.

Figure 9:
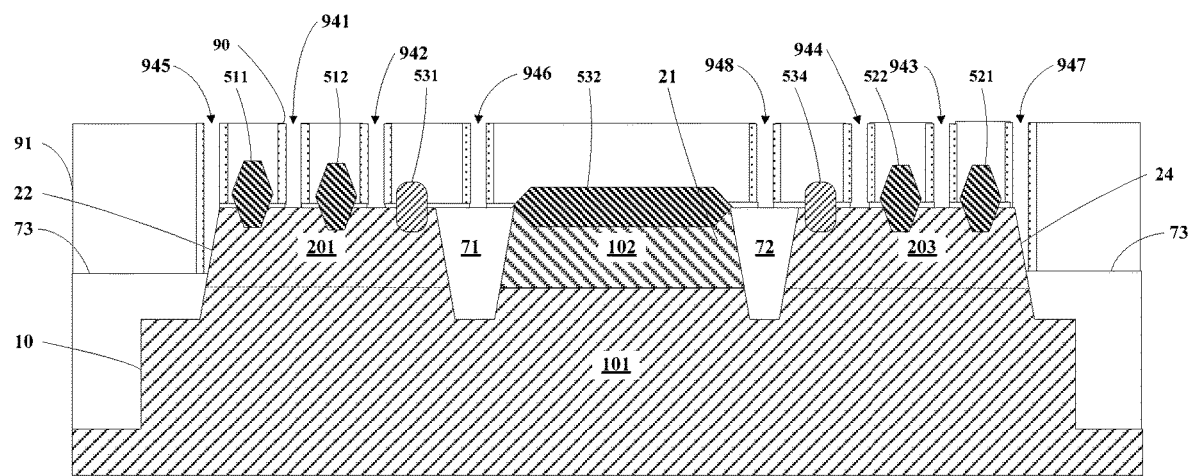

Next, referring to FIG. 9, a first notch 941 is formed by removing the first initial gate structure 81. In some embodiments, when forming the first notch 941, a second notch 942 may be formed by removing the second initial gate structure 82, a third notch 943 and a fourth notch 944 may be formed by removing the third initial gate structure 83 and the fourth initial gate structure 84, respectively, a fifth notch 945, a sixth notch 946, a seventh notch 947, and an eighth notch 948 may also be formed by removing the fifth initial gate structure 85, the sixth initial gate structure 86, the seventh initial gate structure 87, and the eighth initial gate structure 88, respectively.

Figure 10:
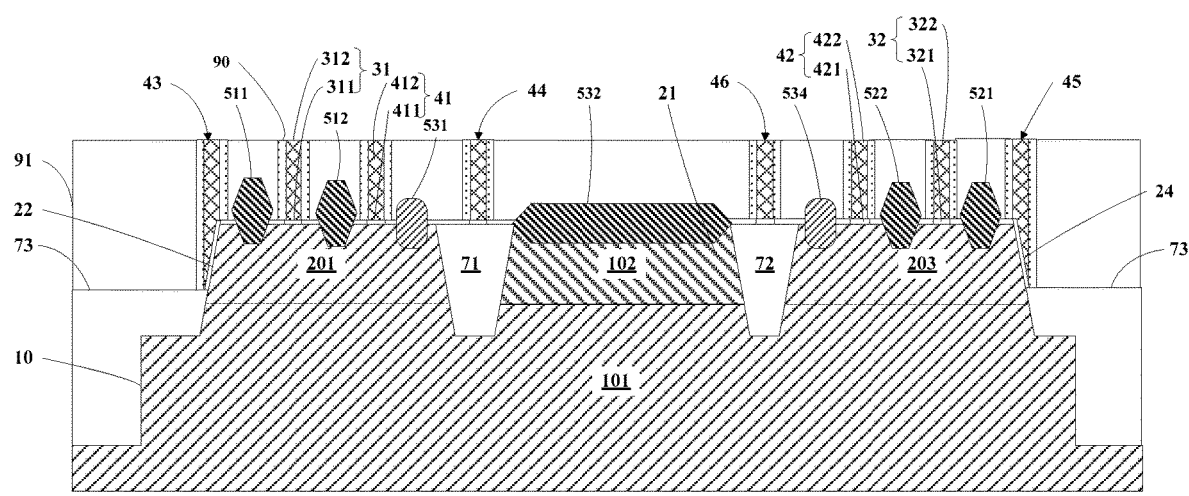

Next, referring to FIG. 10, a first gate structure 31 is formed in the first notch 941 through a deposition process followed by a planarization process. In some embodiments, when forming the first gate structure 31, a first pseudo gate structure 41 may also be formed in the second notch 942, a second gate structure 32 and a second pseudo gate structure 42 may also be formed in the third notch 943 and the fourth notch 944, respectively, a third pseudo gate structure 43, a fourth pseudo gate structure 44, a fifth pseudo gate structure 45, and a sixth pseudo gate structure 46 may also be formed in the fifth notch 945, the sixth notch 946, the seventh notch 947, and the eighth notch 948, respectively.

In some embodiments, the dielectric layer (which may be made of silicon dioxide), a work function metal layer and a gate metal layer may be sequentially deposited in each of the notches, and a planarization process, such as a CMP process, may be applied on these deposited layers so that the first gate structure 31 and the second gate structure 32 are formed in the first notch 941 and the third notch 943, respectively, the first pseudo gate structure 41, the second pseudo gate structure 42, the third pseudo gate structure 43, the fourth pseudo gate structure 44, the fifth pseudo gate structure 45, and the sixth pseudo gate structure 46 are formed in the second notch 942, the fourth notch 944, the fifth notch 945, the sixth notch 946, the seventh notch 947, and the eighth notch 948, respectively. The dielectric layer 91 may work as a gate insulation layer or a pseudo gate insulation layer, and the gate metal layer may work as a gate or a pseudo gate.

This concludes the description of a semiconductor device, its manufacturing method, and a radiation measurement method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
   providing a semiconductor structure, wherein the semiconductor structure comprises a substrate comprising:
   a base area and a collector area; and
   a plurality of semiconductor fins on the substrate, wherein the plurality of semiconductor fins comprises at least a first semiconductor fin and a second semiconductor fin on the base area and separated from each other, wherein the first semiconductor fin comprises an emission area adjacent to the base area, and the second semiconductor fin comprises a first region adjacent to the base area;
   forming a first initial gate structure on the second semiconductor fin;
   forming a first source and a first drain at two opposite sides of the first initial gate structure and at least partially in the first region, wherein a portion of the first region is positioned between the first source and the base area in a direction perpendicular to a face of the base area, directly contacts each of the first source and the base area, and has N type conductivity or P type conductivity;
   forming a dielectric layer on the semiconductor structure, with the dielectric layer exposing an upper surface of the first initial gate structure;
   forming a first notch by removing the first initial gate structure; and
   forming a first gate structure in the first notch.

2. The method of claim 1, wherein the base area has a conductivity type opposite to those of the collector area and the emission area, and the base area and the first region have the same conductivity type.

3. The method of claim 1, wherein when forming the first initial gate structure, a second initial gate structure is formed on the second semiconductor fin and separated from the first initial gate structure, with the first semiconductor fin located closer to the second initial gate structure than the first initial gate structure,
   when forming the first source and the first drain, a first electrode is formed at least partially in the first region, with the first electrode and the first initial gate structure at two opposite sides of the second initial gate structure,
   when forming the dielectric layer, the dielectric layer exposes an upper surface of the second initial gate structure,
   when forming the first notch, a second notch is formed by removing the second initial gate structure,
   and when forming the first gate structure, a first pseudo gate structure is formed in the second notch.

4. The method of claim 3, wherein the plurality of semiconductor fins further comprises a third semiconductor fin on the collector area, wherein the third semiconductor fin comprises a second region adjacent to the collector area, and the second region and the collector area have the same conductivity type,
   and when forming the first electrode, a second electrode at least partially in the emission area and a third electrode at least partially in the second region are formed.

5. The method of claim 1, wherein the plurality of semiconductor fins further comprises a fourth semiconductor fin on the base area and separated from the first semiconductor fin, wherein the fourth semiconductor fin comprises a third region adjacent to the base area, and the third region and the base area have the same conductivity type,
   when forming the first initial gate structure, a third initial gate structure and a fourth initial gate structure are formed on the fourth semiconductor fin and separated from each other, with the first semiconductor fin located closer to the fourth initial gate structure than the third initial gate structure,
   when forming the first source and the first drain, a second source and a second drain are formed at two opposite sides of the third initial gate structure and at least partially in the third region, and a fourth electrode at least partially in the third region is formed, with the fourth electrode and the third initial gate structure at two opposite sides of the fourth initial gate structure.

6. The method of claim 5, wherein when forming the dielectric layer, the dielectric layer exposes upper surfaces of the third initial gate structure and the fourth initial gate structure,
   when forming the first notch, a third notch and a fourth notch are formed by removing the third initial gate structure and the fourth initial gate structure, respectively,
   and when forming the first gate structure, a second gate structure is formed in the third notch, and a second pseudo gate structure is formed in the fourth notch.

7. The method of claim 5, wherein the semiconductor structure further comprising:

a first trench isolation component on the substrate separating the first semiconductor fin and the second semiconductor fin; and a second trench isolation component on the substrate separating the first semiconductor fin and the fourth semiconductor fin.

8. The method of claim 7, wherein the semiconductor structure further comprising:

a third trench isolation component around the plurality of semiconductor fins, with the depth of the third trench isolation component in a range of 500 angstrom to 3000 angstrom, and the dielectric layer on the first trench isolation component, the second trench isolation component, and the third trench isolation component.

9. The method of claim 7, wherein the semiconductor device comprises:

a first pseudo gate structure on the second semiconductor fin; and a first electrode at least partially in the first region, with wherein the first electrode and the first gate structure are at two opposite sides of the first pseudo gate structure, and wherein the first semiconductor fin is located closer to the first pseudo gate structure than to the first gate structure, wherein the second semiconductor fin, the first gate structure, the first source, and the first drain form a first Metal Oxide Semiconductor (MOS) device, wherein the first MOS device is electrically insulated from the base area by applying a first voltage on the first pseudo gate structure and applying a second voltage on the substrate, wherein the power device is the first MOS device in the semiconductor device, and wherein the power device is electrically insulated from the base area of the BJT by applying a first voltage to the first pseudo gate structure in the semiconductor device and a second voltage to the substrate in the semiconductor device.

10. A semiconductor device manufacturing method, comprising:

providing a semiconductor structure, wherein the semiconductor structure comprises a substrate comprising:

a base area and a collector area; and a plurality of semiconductor fins on the substrate, wherein the plurality of semiconductor fins comprises at least a first semiconductor fin and a second semiconductor fin on the base area and separated from each other, wherein the first semiconductor fin comprises an emission area adjacent to the base area, and the second semiconductor fin comprises a first region adjacent to the base area;

forming a first initial gate structure on the second semiconductor fin;

forming a first source and a first drain at two opposite sides of the first initial gate structure and at least partially in the first region;

forming a dielectric layer on the semiconductor structure, with the dielectric layer exposing an upper surface of the first initial gate structure;

forming a first notch by removing the first initial gate structure; and forming a first gate structure in the first notch, wherein when forming the first initial gate structure, a second initial gate structure is formed on the second semiconductor fin and separated from the first initial gate structure, with the first semiconductor fin located closer to the second initial gate structure than the first initial gate structure, when forming the first source and the first drain, a first electrode is formed at least partially in the first region, with the first electrode and the first initial gate structure at two opposite sides of the second initial gate structure, when forming the dielectric layer, the dielectric layer exposes an upper surface of the second initial gate structure, when forming the first notch, a second notch is formed by removing the second initial gate structure, and when forming the first gate structure, a first pseudo gate structure is formed in the second notch.

* * * * *